United States Patent [19]

Kim et al.

[11] Patent Number: 5,742,197
[45] Date of Patent: Apr. 21, 1998

[54] BOOSTING VOLTAGE LEVEL DETECTOR FOR A SEMICONDUCTOR MEMORY DEVICE

[75] Inventors: Hyung-Dong Kim; Chan-Jong Park, both of Seoul, Rep. of Korea

[73] Assignee: Samsung Electronics Co., Ltd., Suwon, Rep. of Korea

[21] Appl. No.: 341,108

[22] Filed: Nov. 18, 1994

[30] Foreign Application Priority Data

Nov. 18, 1993 [KR] Rep. of Korea ............... 24669/1993

[51] Int. Cl.$^6$ ............................................. G05F 1/10
[52] U.S. Cl. ...................................... 327/537; 327/535
[58] Field of Search ............................ 327/112, 333, 327/536, 537, 541, 543, 589, 534, 77, 78, 80, 81, 535; 326/81, 83, 85, 87, 88; 365/184.09, 189.11

[56] References Cited

U.S. PATENT DOCUMENTS

| | | | |
|---|---|---|---|
| Re. 34,290 | 6/1993 | Tobita | 327/537 |
| 3,914,702 | 10/1975 | Gehweiler | 327/537 |
| 4,663,584 | 5/1987 | Okada et al. | 327/537 |
| 4,782,247 | 11/1988 | Yoshida | 327/543 |
| 4,794,278 | 12/1988 | Vajdic | 327/537 |
| 4,820,936 | 4/1989 | Veendrick et al. | 327/534 |
| 4,947,064 | 8/1990 | Kim et al. | 327/430 |
| 4,961,007 | 10/1990 | Kumanoya et al. | 327/537 |
| 4,967,103 | 10/1990 | Dikken et al. | 326/87 |
| 4,983,860 | 1/1991 | Yim et al. | 326/87 |
| 4,988,894 | 1/1991 | Takiba et al. | 327/437 |
| 5,072,134 | 12/1991 | Min | 327/537 |
| 5,128,560 | 7/1992 | Chern et al. | 326/81 |
| 5,202,587 | 4/1993 | McLaury | 327/536 |
| 5,208,488 | 5/1993 | Takiba et al. | 327/546 |
| 5,264,808 | 11/1993 | Tanaka | 327/534 |
| 5,270,584 | 12/1993 | Koshikawa et al. | 327/534 |
| 5,278,460 | 1/1994 | Casper | 327/333 |
| 5,296,801 | 3/1994 | Ohtsuka et al. | 327/537 |
| 5,336,952 | 8/1994 | Iwahashi et al. | 327/427 |
| 5,341,045 | 8/1994 | Almulla | 326/62 |
| 5,355,033 | 10/1994 | Jang | 327/543 |
| 5,367,489 | 11/1994 | Park et al. | 365/189.11 |
| 5,389,842 | 2/1995 | Hardee | 327/391 |
| 5,493,244 | 2/1996 | Pathak et al. | 327/313 |

*Primary Examiner*—Timothy P. Callahan
*Assistant Examiner*—My-Trang Nu Ton
*Attorney, Agent, or Firm*—Cushman Darby & Cushman IP Group of Pillsbury Madison & Sutro LLP

[57] ABSTRACT

A boosting voltage level detector for a semiconductor memory device which utilizes a boosting voltage the level of which is higher than that of a power supply voltage, which includes a pull-up portion and a pull-down portion. In a preferred embodiment, the pull-up portion includes a PMOS transistor and a first NMOS transistor connected in series between the power supply voltage and an output node, and the pull-down portion includes second and third NMOS transistors connected in series between the output node and ground. The PMOS transistor has a gate electrode which is coupled to ground, and thus functions as a current source. The second NMOS transistor has a gate electrode which is coupled to a reference voltage, and thus functions as a resistor. The gate electrodes of the first and third NMOS transistors are commonly coupled to the boosting voltage. The detector further includes an inverter circuit coupled to the output node. The voltage value of the output node rises above the trip point level of the inverter in response to the boosting voltage rising above a predetermined voltage level, and the voltage value of the output node falls below the trip point level in response to the boosting voltage falling below the predetermined voltage level.

21 Claims, 1 Drawing Sheet

BOOSTING VOLTAGE LEVEL DETECTOR FOR A SEMICONDUCTOR MEMORY DEVICE

BACKGROUND OF THE INVENTION

The present invention relates generally to semiconductor memory devices, and, more particularly, to a boosting voltage level detector for accurately detecting the level of a boosting voltage which is produced by boosting a power supply voltage.

In general, data is read from a selected memory cell of a semiconductor memory device, e.g., a dynamic random access memory device (DRAM), by transferring charge stored in a capacitor of the memory cell, through the channel of a MOSFET access or transfer transistor, to a bit line, and thence, to a data I/O line. Because of the inevitable voltage drop which occurs as the charge is being transferred through the channel of the access transistor, it has become necessary to boost the power supply voltage, Vcc, which is supplied to the semiconductor memory device, and to apply the resultant boosting voltage, Vpp, to the gate of the transfer transistor, via a word line. By thus using this boosting voltage in place of the power supply voltage, data read errors due to insufficient charge being transferred through the access transistor to the bit line are minimized.

A representative example of a bootstrapping or boosting circuit for generating such a boosting voltage is disclosed in an article entitled "An Experimental 1.5-V 64-Mb DRAM", which appeared in the *IEEE Journal of Solid-State Circuits*, Vol. 26, No. 4, pp. 465–472, April 1991. In order to ensure accurate and effective operation of such a voltage boosting circuit, it is necessary to use a circuit which is capable of accurately detecting the boosting voltage level.

An exemplary boosting voltage level detector is disclosed in Korean patent application number 92-11242, filed Jun. 26, 1992, by the present inventor, and entitled "Boosting Device of a Semiconductor Memory". This boosting voltage level detector includes an NMOS pull-up transistor and an NMOS pull-down transistor connected in series between the power supply voltage, Vcc, and a ground voltage, Vss. A boosting level detection signal is output at a node intermediate the pull-up and pull-down transistors. The output node is coupled to an inverter chain which amplifies the boosting level detection signal. The gate electrode of the pull-up transistor is coupled to the boosting voltage Vpp, and the gate electrode of the pull-down transistor is coupled to a constant reference voltage Vref. With this configuration, the output node, and thus, the boosting level detection signal, is driven high when the boosting voltage Vpp reaches a predetermined desired level, and is driven low when the boosting voltage Vpp is lower than the predetermined desired level. However, there exists a delay between the time the boosting voltage Vpp goes from high to low (or vice versa), and the time the boosting level detection signal reaches the trip point of the inverter chain. Because of this gap, there are times when the boosting level detection signal does not accurately reflect the level of the boosting voltage Vpp. Consequently, the reliability of the boosting voltage level detector is compromised.

Based on the above, it can be appreciated that there presently exists a need in the art for a boosting voltage level detector which overcomes the above-described shortcomings of the present inventor's previously proposed boosting voltage level detector, and other presently available boosting voltage level detectors. The present invention fulfills this need.

SUMMARY OF THE INVENTION

The present invention encompasses a boosting voltage level detector for a semiconductor memory device which utilizes a boosting voltage the level of which is higher than that of a power supply voltage, which includes a pull-up portion having a variable resistance which is controlled by the boosting voltage and a pull-down portion having a variable resistance which is controlled by the boosting voltage. In a preferred embodiment, the pull-up portion includes a PMOS transistor and a first NMOS transistor connected in series between the power supply voltage and an output node, and the pull-down portion includes second and third NMOS transistors connected in series between the output node and ground. The PMOS transistor has a gate electrode which is coupled to ground, and thus functions as a current source. The second NMOS transistor has a gate electrode which is coupled to a reference voltage, and thus functions as a resistor. The gate electrodes of the first and third NMOS transistors are commonly coupled to the boosting voltage. The detector further includes an inverter circuit coupled to the output node. The voltage value of the output node rises above the trip point level of the inverter in response to the boosting voltage rising above a predetermined voltage level, and the voltage value of the output node falls below the trip point level in response to the boosting voltage falling below the predetermined voltage level.

BRIEF DESCRIPTION OF THE DRAWINGS

These and various other features and advantages of the present invention will be readily understood with reference to the following detailed description taken in conjunction with the accompanying drawing, in which.

DETAILED DESCRIPTION OF THE INVENTION

Figure 1:
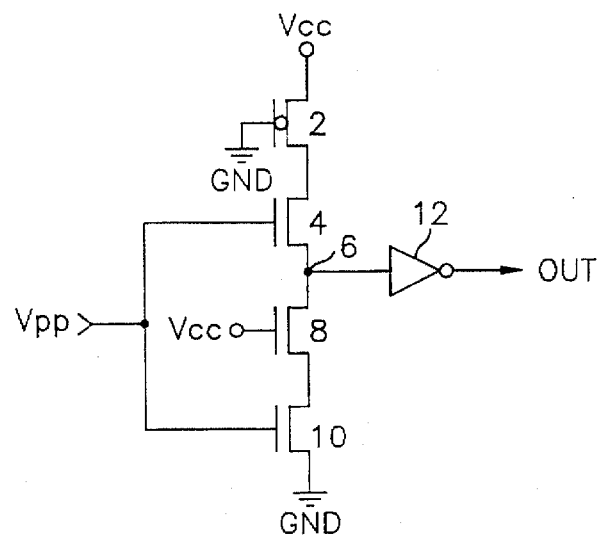
FIG. 1 is a circuit diagram of a boosting voltage level detector constructed in accordance with a preferred embodiment of the present invention.

With reference now to FIG. 1, there can be seen a boosting voltage level detector constructed in accordance with a preferred embodiment of the present invention. The boosting voltage level detector depicted in FIG. 1 includes a PMOS transistor 2 and three NMOS transistors 4, 8, and 10, connected in series between a power supply voltage Vcc and ground. The gate electrode of the PMOS transistor 2 is coupled to ground. The gate electrode of the NMOS transistor 8 is coupled to the power supply voltage Vcc. The gate electrodes of the NMOS transistors 4 and 10 are commonly coupled to the boosting voltage Vpp. The boosting voltage level detector has an output node 6 intermediate the NMOS transistors 4 and 8, which is coupled to an inverter 12, whose output, labelled OUT, and termed oscillator enable signal, is coupled to an oscillator (not shown) of a pumping circuit (not shown) which generates the boosting voltage Vpp.

The PMOS transistor 2 functions as a current source, and the NMOS transistor 8 functions as a resistor. The PMOS transistor 2 and the NMOS transistor 4 connected in series between the power supply voltage Vcc and the output node 6 constitute a pull-up portion of the circuit, and the NMOS transistors 8 and 10 connected in series between the output node 6 and ground constitute a pull-down portion of the circuit. For reasons which will become clear from the ensuing description of the operation of the boosting voltage level detector depicted in FIG. 1, this circuit is capable of quickly and accurately detecting when the boosting voltage Vpp exceeds or falls below a predetermined voltage level, e.g., 2Vcc.

Figure 2:
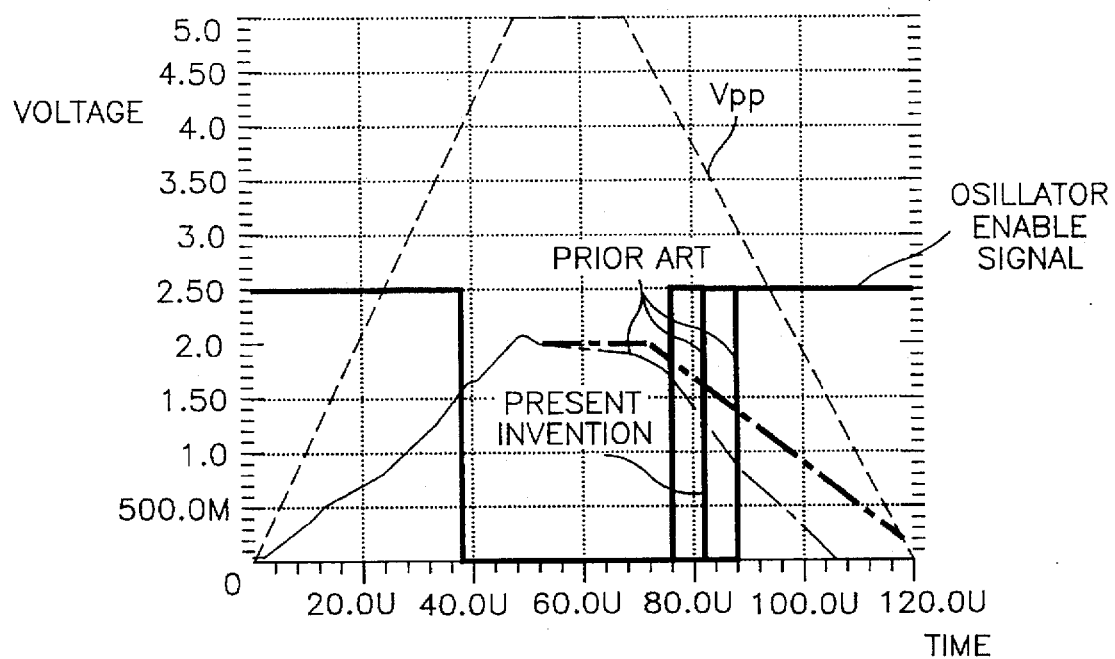
FIG. 2 is a timing diagram illustrating the timing of the conventional boosting circuit and the boosting circuit according to the present invention.

The boosting voltage level detector of the present invention operates in the following manner. More particularly, the current flow through the NMOS transistors 4 and 10 of the pull-up and pull-down portions of the circuit, respectively, is controlled by the boosting voltage Vpp. The NMOS transistors 4 and 10 are each constructed to have a threshold voltage whose level is such that when the boosting voltage Vpp applied to the gate electrodes thereof rises above the predetermined voltage, e.g., 2Vcc, they are turned on, and when the boosting voltage Vpp falls below the predetermined voltage, they are turned off. In essence, the NMOS transistor 4 has a variable resistance R4 whose value is controlled by the boosting voltage Vpp, and the NMOS transistor 10 has a variable resistance R10 whose value is also controlled by the boosting voltage Vpp. Thus, the voltage at the output node 6 has a value which is determined by the resistance ratio R10/(R4+R10). With this configuration, the specific values can be set to ensure that the voltage level of the output node 6 quickly and accurately rises above or falls below the trip point level of the inverter 12 in response to the boosting voltage Vpp rising above or falling below the predetermined voltage, e.g., 2Vcc. In this way, the "gap problem" suffered by the boosting voltage level detector previously proposed by the present inventor and discussed hereinbefore, is overcome. The timing diagrams of the conventional boosting circuit and the boosting circuit of the present invention, illustrated in FIG. 2, graphically illustrate this point.

Although a presently preferred embodiment of the present invention has been described in detail hereinabove, it should be clearly understood that many variations and/or modifications thereof which may appear to those skilled in the art will still fall within the spirit and scope of the present invention as defined in the appended claims. For example, it will be readily recognized that additional and/or other forms of resistors, current sources, variable resistors, and loading capacitors can be utilized in addition to and/or in place of the circuit elements of the boosting voltage level detector circuit depicted in FIG. 1.

As will be readily appreciated by those skilled in the art, the boosting level detection signal which appears at the output node 6, is inverted and amplified by the inverter 12 (which can be comprised of a chain of inverters). The oscillator enable signal output by the inverter 12 is utilized to start and stop the oscillator (not shown) of the pumping circuit (not shown) which produces the boosting voltage Vpp.

What is claimed is:

1. A boosting voltage level detector for a semiconductor memory device which utilizes a boosting voltage the level of which is higher than that of a power supply voltage, said detector comprising:

a pull-up portion having a variable resistance which is controlled by the boosting voltage, said pull-up portion including a current source means and a pull-up transistor connected in series between the power supply voltage and an output node; and, a pull-down portion having a variable resistance which is controlled by the boosting voltage, said pull-up portion and said pull-down portion cooperating so that said voltage level detector senses the boosting voltage level and outputs a signal in accordance with said sensed boosting voltage level.

2. The detector as set forth in claim 1, wherein said pull-up transistor is a MOS transistor having a gate electrode coupled to the boosting voltage.

3. The detector as set forth in claim 2, wherein said pull-down transistor is a MOS transistor having a gate electrode coupled to the boosting voltage.

4. The detector as set forth in claim 1, wherein said current source means comprises a PMOS transistor having a gate electrode coupled to a first reference voltage, a first electrode coupled to the power supply voltage, and a second electrode.

5. The detector as set forth in claim 4, wherein said pull-up transistor comprises a first NMOS transistor having a gate electrode coupled to the boosting voltage, a first electrode coupled to said second electrode of said PMOS transistor, and a second electrode coupled to said output node.

6. The detector as set forth in claim 5, wherein said pull-down portion comprises a resistor means and a pull-down transistor connected in series between said output node and said first reference voltage.

7. The detector as set forth in claim 6, wherein said resistor means comprises a second NMOS transistor having a first electrode coupled to said output node, a gate electrode coupled to a second reference voltage, and a second electrode.

8. The detector as set forth in claim 7, wherein said pull-down transistor comprises a third NMOS transistor having a first electrode coupled to said second electrode of said second NMOS transistor, a gate electrode coupled to the boosting voltage, and a second electrode coupled to said first reference voltage.

9. The detector as set forth in claim 8, wherein said first NMOS transistor has a threshold voltage whose level is such that when the boosting voltage exceeds a predetermined voltage level, said first NMOS transistor is turned on, and when the boosting voltage falls below said predetermined voltage level, said first NMOS transistor is turned off.

10. The detector as set forth in claim 9, wherein said third NMOS transistor has a threshold voltage whose level is such that when the boosting voltage exceeds said predetermined voltage level, said third NMOS transistor is turned on, and when the boosting voltage falls below said predetermined voltage level, said third NMOS transistor is turned off.

11. The detector as set forth in claim 8, further comprising an inverter circuit having a trip point level which inputs said signal.

12. The detector as set forth in claim 11, wherein said first NMOS transistor has a variable resistance R1, said third NMOS transistor has a variable resistance R2, and said output node has a voltage value determined by the resistance ratio R1/(R1+R2).

13. The detector as set forth in claim 12, wherein said voltage value of said output node rises above said trip point level in response to the boosting voltage rising above said predetermined voltage level, and said voltage value of said output node falls below said trip point level in response to the boosting voltage falling below said predetermined voltage level.

14. The detector as set forth in claim 8, wherein said first reference voltage is a ground voltage and said second reference voltage is said power supply voltage.

15. A boosting voltage level detector for a semiconductor memory device which utilizes a boosting voltage the level of which is higher than that of a power supply voltage, said detector comprising:

a pull-up portion including a pull-up MOS transistor whose switching operation is controlled by the boosting voltage and a current source means connected in series with said pull-up transistor between the power supply voltage and an output node; and, a pull-down portion including a pull-down MOS transistor whose switching operation is controlled by the boosting voltage and a resistor means connected in series with said pull-down transistor between said output node and a first reference voltage, said pull-up portion and said pull-down portion cooperating so that said voltage level detector senses the boosting voltage level and outputs a signal in accordance with said sensed boosting voltage level.

16. The detector as set forth in claim 15, wherein:

said current source means comprises a PMOS transistor having a gate electrode coupled to said first reference voltage, a first electrode coupled to the power supply voltage, and a second electrode coupled to an electrode of said pull-up transistor; and, said resistor means comprises an NMOS transistor having a first electrode coupled to said output node, a gate electrode coupled to a second reference voltage, and a second electrode coupled to an electrode of said pull-down transistor.

17. The detector as set forth in claim 16, further comprising an inverter circuit having a trip point level, and wherein said output node has a voltage value which rises above said trip point level in response to the boosting voltage rising above a predetermined voltage level, and said voltage value of said output node falls below said trip point level in response to the boosting voltage falling below said predetermined voltage level.

18. The detector as set forth in claim 17, wherein said pull-up transistor has a variable resistance R1, said NMOS transistor has a variable resistance R2, and said voltage value of said output node is determined by the resistance ratio R1/(R1 +R2).

19. The detector as set forth in claim 16, wherein said first reference voltage is a ground voltage and said second reference voltage is said power supply voltage.

20. A boosting voltage level detector for a semiconductor memory device which utilizes a power supply voltage and a boosting voltage, the level of said boosting voltage intended to be higher than that of said power supply voltage, said detector comprising:

a PMOS transistor having a first electrode coupled to the power supply voltage, a gate electrode coupled to a first reference voltage, and a second electrode;

a first NMOS transistor having a first electrode coupled to said second electrode of said PMOS transistor, a gate electrode coupled to the boosting voltage, and a second electrode coupled to an output node;

a second NMOS transistor having a first electrode coupled to said output node, a gate electrode coupled to a second reference voltage, and a second electrode;

a third NMOS transistor having a first electrode coupled to said second electrode of said second NMOS transistor, a gate electrode coupled to the boosting voltage, and a second electrode coupled to said first reference voltage;

an inverter circuit coupled to said output node, said inverter having a trip point level; and, wherein said voltage value of said output node rises above said trip point level in response to the boosting voltage rising above a predetermined voltage level that is higher than that of said power supply voltage, and said voltage value of said output node falls below said trip point level in response to the boosting voltage falling below said predetermined voltage level.

21. The detector as set forth in claim 20, wherein said first reference voltage is a ground voltage and said second reference voltage is said power supply voltage.

* * * * *